US008119438B2

(12) United States Patent
Nishimoto

(10) Patent No.: US 8,119,438 B2
(45) Date of Patent: Feb. 21, 2012

(54) METHOD OF MANUFACTURING SOLAR CELL

(75) Inventor: Yoichiro Nishimoto, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 152 days.

(21) Appl. No.: 12/519,406

(22) PCT Filed: Oct. 24, 2007

(86) PCT No.: PCT/JP2007/071172
§ 371 (c)(1),
(2), (4) Date: Jun. 16, 2009

(87) PCT Pub. No.: WO2009/054076
PCT Pub. Date: Apr. 30, 2009

(65) Prior Publication Data
US 2010/0029034 A1 Feb. 4, 2010

(51) Int. Cl.
*H01L 31/18* (2006.01)
(52) U.S. Cl. .......... 438/71; 438/409; 438/665; 438/689; 438/960; 257/739; 257/E25.007; 257/E27.124; 257/E31.13; 257/E33.013
(58) Field of Classification Search .............. 438/71, 438/409, 665, 689, 745, 747, 753, 960; 257/739, 257/E25.007, E27.124, E33.013, E33.018, 257/E31.13
See application file for complete search history.

(56) References Cited

U.S. PATENT DOCUMENTS

| | | | |
|---|---|---|---|
| 6,207,890 B1 * | 3/2001 | Nakai et al. | 136/246 |
| 7,192,885 B2 * | 3/2007 | Hauser et al. | 438/753 |
| 2002/0119663 A1 | 8/2002 | Matsuura et al. | |
| 2005/0101153 A1 | 5/2005 | Matsuura et al. | |
| 2005/0126627 A1 * | 6/2005 | Hayashida | 136/257 |
| 2007/0151944 A1 * | 7/2007 | Du | 216/24 |
| 2009/0038682 A1 | 2/2009 | Komatsu et al. | |

FOREIGN PATENT DOCUMENTS

| | | |
|---|---|---|
| EP | 1 753 032 A1 | 2/2007 |
| JP | 5-267270 A | 10/1993 |
| JP | 9-102625 A | 4/1997 |
| JP | 10-079524 A | 3/1998 |
| JP | 3189201 B2 | 7/2001 |

(Continued)

OTHER PUBLICATIONS

Form PCT/ISA/210 (International Search Report) dated Nov. 27, 2007.
Non-English version of Form PCT/ISA/237 (Written Opinion of the International Searching Authority) dated Nov. 27, 2007.

(Continued)

*Primary Examiner* — Hsien Ming Lee
*Assistant Examiner* — Walter H Swanson
(74) *Attorney, Agent, or Firm* — Buchanan Ingersoll & Rooney PC

(57) ABSTRACT

A method of manufacturing a solar cell having a texture on a surface of a silicon substrate includes first forming a porous layer on the surface of the silicon substrate by dipping the silicon substrate into a mixed aqueous solution of oxidizing reagent containing metal ions and hydrofluoric acid. Second, a texture is formed by etching the surface of the silicon substrate after the porous layer is formed, by dipping the silicon substrate into a mixed acid mainly containing hydrofluoric acid and nitric acid.

6 Claims, 13 Drawing Sheets

FOREIGN PATENT DOCUMENTS

| | | | |
|---|---|---|---|
| JP | 3271990 | A1 | 1/2002 |
| JP | 2002-184751 | A | 6/2002 |
| JP | 2002-252202 | A | 9/2002 |
| JP | 2004-071626 | A | 3/2004 |
| JP | 2005-142457 | A | 6/2005 |
| JP | 2005-150614 | A | 6/2005 |
| JP | 2005-183505 | A | 7/2005 |
| JP | 2005-217260 | A | 8/2005 |
| JP | 2005217193 | * | 8/2005 |
| JP | 2005-268285 | A | 9/2005 |
| JP | 2005-277208 | A | 10/2005 |
| JP | 2005-311060 | A | 11/2005 |
| JP | 2006-140409 | A | 6/2006 |
| JP | 3925867 | B2 | 6/2007 |
| JP | 2007-194485 | | 8/2007 |
| WO | WO 03/105209 | A1 | 12/2003 |
| WO | 2005/059985 | A1 | 6/2005 |
| WO | WO 2005/117138 | | 12/2005 |

OTHER PUBLICATIONS

Decision of Patent Grant dated Sep. 14, 2010, issued in the corresponding Japanese Patent Application No. 2009-506461, and an English Translation thereof.

Korean Office Action dated Mar. 2, 2011 in corresponding Korean application.

Supplementary European Search Report dated Apr. 11, 2011 issued in corresponding Application No. EP 07 83 0906.

Koynov et al., "Black nonreflecting silicon surfaces for solar cells", Applied Physics Letters 88, 203107 (2006).

Hauser et al., "A Simplified Process for Isotropic Texturing of MC-SI", Proceedings of the 3rd World Conference on Photovoltaic Energy Conversion, May 11, 2003.

* cited by examiner

- FORM POROUS LAYER USING METAL ION — S1
- WATER WASHING — S2
- SURFACE ETCHING BY MIXED ACID — S3
- WATER WASHING — S4
- ALKALI DIP (FEW %, RT, ABOUT 10 SECONDS) — S5
- WATER WASHING — S6
- HYDROFLUORIC ACID DIP — S7
- WATER WASHING — S8

FIG.19

| WAFER USED TO MANUFACTURE SOLAR CELL (2×2 cm) | Jsc [mA/cm2] |
|---|---|
| WAFER APPLIED WITH PATENT DOCUMENT 3 | 29.735 |
| WAFER APPLIED WITH ALKALI TEXTURE | 32.953 |

FIG.20

| WAFER USED TO MANUFACTURE SOLAR CELL (15×15 cm) | Jsc [mA/cm2] |
|---|---|
| WAFER APPLIED WITH METHOD ACCORDING TO FIRST EMBODIMENT | 32.391 |
| WAFER APPLIED WITH ALKALI TEXTURE | 32.158 |

FIG.21

| WAFER USED TO MANUFACTURE SOLAR CELL (2×2 cm) | Jsc [mA/cm2] |
|---|---|
| WAFER APPLIED WITH ALKALI TEXTURE | 33.779 |
| WAFER MANUFACTURED BY USING CHEMICAL OF [Ag+] =1E-4M ACCORDING TO SECOND EMBODIMENT | 33.588 |
| WAFER MANUFACTURED BY USING CHEMICAL OF [Ag+] =5E-5M ACCORDING TO SECOND EMBODIMENT | 32.886 |

Flat Vessel

METHOD OF MANUFACTURING SOLAR CELL

CROSS-REFERENCE TO RELATED APPLICATIONS

This application claims the benefit of International Stage Application No. PCT/JP2007/071172, filed Oct. 24, 2007, the entire contents of which is incorporated herein by reference.

TECHNICAL FIELD

The present invention relates to a method of manufacturing a silicon solar cell, and more particularly, to a method of forming fine irregularities (texture) on a surface of a silicon substrate.

BACKGROUND ART

Typically, fine irregularities are formed on a surface of a solar cell to suppress surface reflection. The incident light is subjected to a multiple reflection by the fine irregularities and is efficiently absorbed into the inside of the solar cell. These fine irregularities are called a texture.

Generally, in a monocrystalline-silicon solar cell, a texture is formed by wet etching using an alkaline aqueous solution such as NaOH or KOH and isopropylalcohol (IPA). Because this technique uses a difference of etching speeds on a crystal plane, it is effective when a wafer is configured by a single crystal plane like a monocrystalline silicon; however, the reflectance cannot be sufficiently decreased when various crystal planes are present within a plane like a polycrystalline silicon.

Therefore, a texture forming method that is not dependent on a crystal plane orientation, such as a mechanical processing method (for example, Patent Document 1) and a reactive ion-etching method (for example, Patent Document 2), has been studied. The mechanical processing method is a single-wafer process, and the reactive ion-etching method uses a vacuum equipment although a certain number of wafers can be batch processed. Consequently, these methods take considerable processing costs.

Therefore, the following method of forming a texture is disclosed (Patent Document 3), in which a porous silicon layer is formed on a surface of a silicon substrate by dipping the silicon substrate into a mixed aqueous solution of oxidizing reagent containing a metal ion and hydrofluoric acid. Thereafter, the substrate formed with the porous silicon layer is dipped into alkali, thereby forming a texture. In relation to this, a mechanism of forming a pit on silicon adhered with a metal is described in Patent Document 4.

Patent Document 1: Japanese Patent No. 3189201
Patent Document 2: Japanese Patent Application Laid-open No. H09-102625
Patent Document 3: Japanese Patent No. 3925867
Patent Document 4: Japanese Patent Application Laid-open No. 2004-71626

DISCLOSURE OF INVENTION

Problem to be Solved by the Invention

However, a silicon substrate having a porous silicon layer manufactured following the method proposed in Patent Document 3 discolors a wafer surface and does not show hydrophobic property as a characteristic of a cleaned surface of silicon, although this silicon substrate has low reflectance. This is considered because not only holes are formed on the silicon surface but also the property of the silicon on the surface is altered.

The wafer is further dipped for an hour into nitric acid of 60% to remove silver adhered to the wafer, and thereafter, a solar cell is manufactured using the wafer. As a result of evaluating the characteristic of the solar cell, it is found out that the characteristic of the solar cell is substantially degraded as compared with a characteristic of a solar cell to which a texture formed by using an alkaline aqueous solution and IPA (hereinafter, simply "alkali texture") is applied. This is considered because of the following reason. The metal could not be completely removed even after the process of dipping the wafer into the nitric acid of 60% for an hour. Because this metal was diffused in a solar-cell manufacturing process, thereby lowering the crystal quality, the characteristic of the solar cell was substantially degraded.

Therefore, to obtain an efficient solar cell by using the method of manufacturing a porous silicon layer using an oxidizing reagent containing a metal ion and hydrofluoric acid, a process of exposing a cleaned surface of silicon and removing a remaining metal after forming the porous silicon layer is necessary.

The present invention has been achieved in view of the above problems, and an object of the invention is to achieve a method of manufacturing a solar cell having high performance, by exposing a cleaned surface of silicon and by removing a remaining metal, after forming a porous silicon layer by using an oxidizing reagent containing a metal ion and hydrofluoric acid.

Means for Solving Problem

To solve the above problems and to achieve the object, a solar-cell manufacturing method according to the present invention is for manufacturing a solar cell having a texture on a surface of a silicon substrate. The solar-cell manufacturing method includes a first process of forming a porous layer on the surface of the silicon substrate by dipping the silicon substrate into a mixed aqueous solution of an oxidizing reagent containing metal ions and hydrofluoric acid; and a second process of forming a texture by etching the surface of the silicon substrate after passing the first process by dipping the silicon substrate into a mixed acid mainly containing hydrofluoric acid and nitric acid.

Effect of the Invention

According to the present invention, when a porous layer formed by using a metal ion is etched to such an extent that a reflectance reduction effect is not lost by a mixed acid mainly containing hydrofluoric acid and nitric acid, a clean silicon surface can be obtained while maintaining the reflectance reduction effect, and a metal at bottoms of pores can be removed. Therefore, there is an effect that a solar cell having high performance can be manufactured. Further, because the etching is performed simultaneously with the removal of the metal, there is an effect that the manufacturing process can be simplified.

BRIEF DESCRIPTION OF DRAWINGS

FIG. 19 is an explanatory diagram of a comparison between a short-circuit photoelectric-current density of a solar cell manufactured by using a texture manufactured by applying the example of Patent Document 3 and a short-circuit photoelectric-current density of an alkali texture cell.

FIG. 20 is an explanatory diagram of a comparison between a short-circuit photoelectric-current density of a solar cell manufactured by applying the manufacturing method according to the first embodiment of the present invention and a short-circuit photoelectric-current density of an alkali texture cell.

FIG. 21 is an explanatory diagram of a comparison between a short-circuit photoelectric-current density of a solar cell manufactured by forming a porous layer by using a mixed solution of a hydrogen peroxide solution containing an Ag of different concentrations and hydrofluoric acid and a short-circuit photoelectric-current density of an alkali texture cell.

EXPLANATIONS OF LETTERS OR NUMERALS

S1 to S8, S11 to S14 Steps

BEST MODE(S) FOR CARRYING OUT THE INVENTION

The present inventors prepared a texture following the example described in Patent Document 3, evaluated a characteristic of the texture, and sorted out problems of the method described in Patent Document 3. Details and problems of an operation performed following the example of Patent Document 3 are described below.

Figure 5:
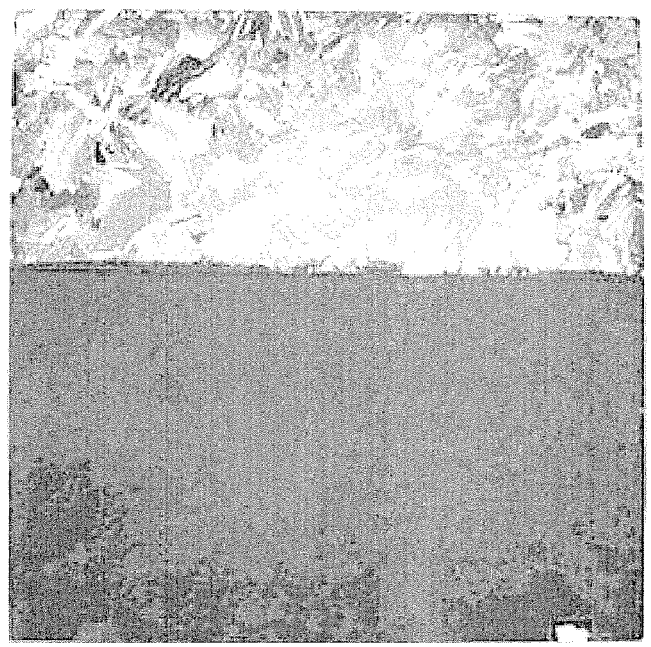
FIG. 5 is an image obtained by imaging an appearance of a wafer etched by a mixed solution of a hydrogen peroxide solution containing an Ag ion and hydrofluoric acid following an example of Patent Document 3.
Figure 6:
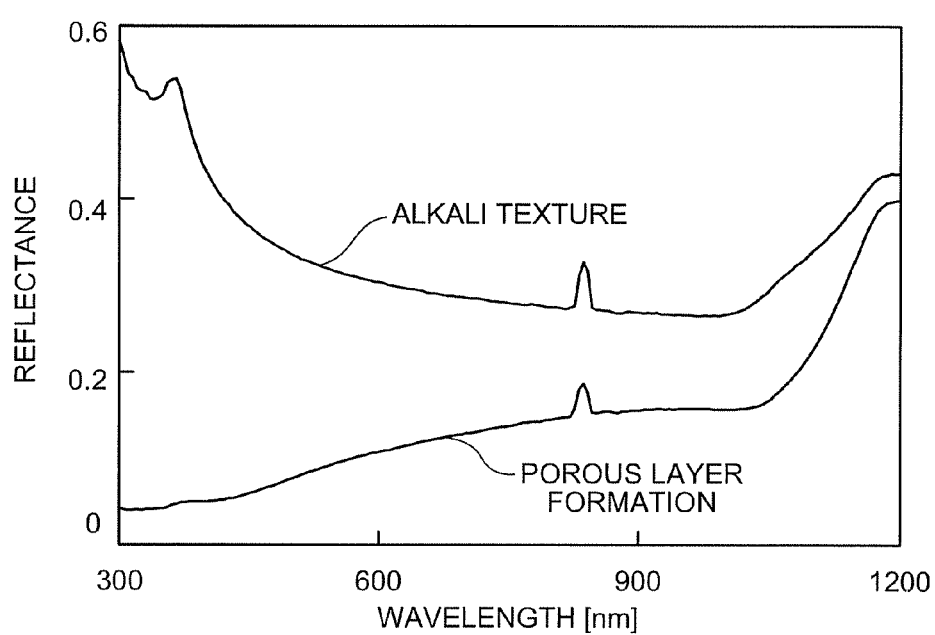
FIG. 6 is a graph of a result of measurement of reflectance of a wafer formed with a porous layer following the example of Patent Document 3 and reflectance of a wafer of an alkali texture.

The present inventors first prepared a polycrystalline silicon substrate having removed a layer damaged when the substrate was cut out from a bulk material. The inventors etched the polycrystalline silicon substrate by a mixed aqueous solution of hydrogen peroxide containing a silver ion by 1E-4M (M=mol/L) and hydrofluoric acid. FIG. 5 is an image obtained by imaging an appearance of a sample of an etched lower half of a wafer. FIG. 6 depicts a result of measurement of reflectance. As shown in FIG. 6, while a portion having a porous layer formed by the etching indicated lower reflectance than that of a wafer having an alkali texture, the wafer surface was discolored and a hydrophobic property as a characteristic of the cleaned surface of silicon was not indicated, as shown in FIG. 5. Etching was then performed for 10 minutes by a sodium hydroxide aqueous solution of 1%. However, the wafer surface did not have a hydrophobic plane even after an HF clean process of natural-oxidation-film removal was performed. Because a hydrophobic plane was not obtained on the wafer surface after forming the porous layer, it is considered that not only pores were formed in silicon but also silicon on the surface was altered, and the altered silicon is not removed even after performing alkali etching.

Figure 7:
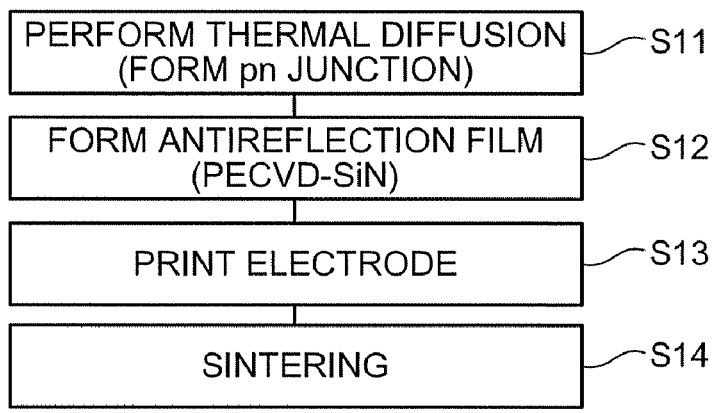
FIG. 7 is a flowchart for explaining an operation of manufacturing a solar cell from a wafer.

The present inventors further dipped this wafer for one hour into nitric acid of 60% to remove adhered silver, and thereafter, manufactured a solar cell (cell size: 2×2 cm) from this wafer by performing processes shown in FIG. 7. As shown in FIG. 7, thermal dispersion treatment was performed to form a pn junction (Step S11). A silicon nitride film as an antireflection film was then deposited on the wafer surface by using a plasma vapor-phase growing device (Step S12). An electrode was then printed (Step S13), and the electrode was adhered by sintering (Step S14), to manufacture a solar cell.

Figure 8:
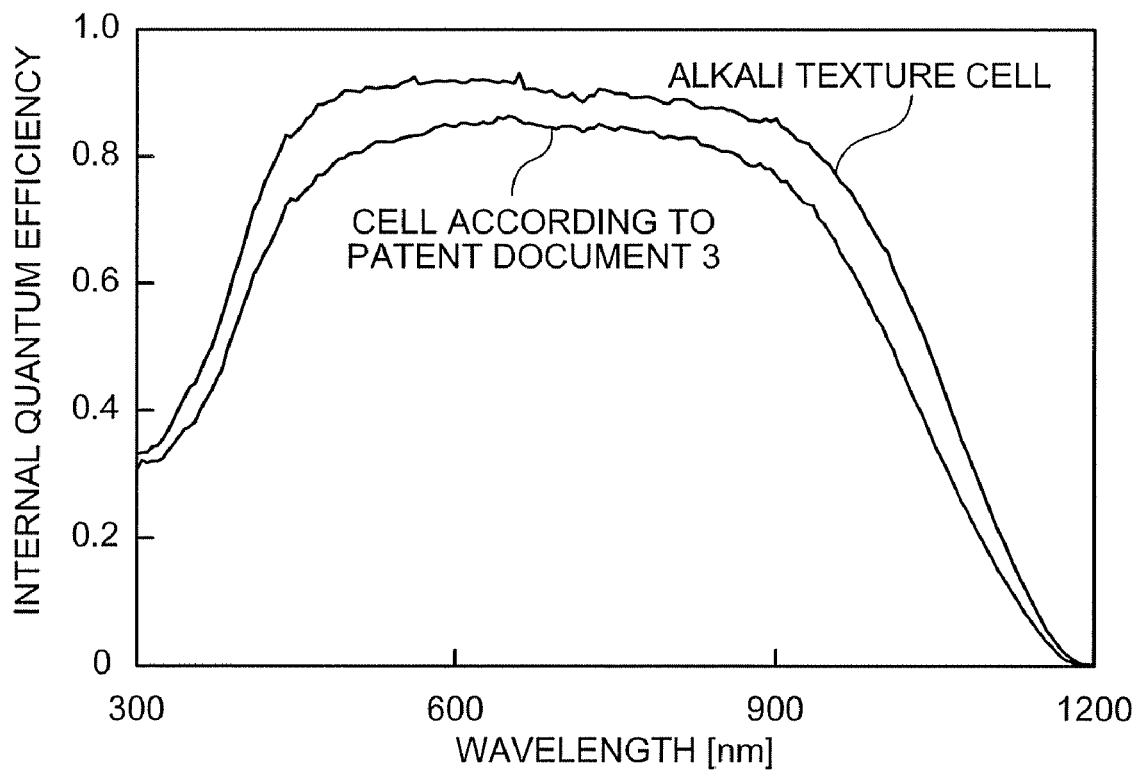
FIG. 8 is a graph of an internal quantum efficiency of a solar cell manufactured by using the wafer manufactured following the example of Patent Document 3 and an internal quantum efficiency of a solar cell manufactured by using a wafer to which an alkali texture is applied.

FIG. 8 is an explanatory diagram of a short-circuit photo-electric-current density Jsc of the solar cell manufactured in this way. FIG. 8 also depicts a characteristic of a solar cell to which an alkali texture is applied, for comparison. As a result, it is clear that a characteristic of the solar cell manufactured by the inventors as described above is substantially degraded as compared with a characteristic of that with the alkali texture, and that the technique described in Patent Document 3 cannot be used as it is for a solar cell.

In manufacturing a semiconductor device, a high-quality solar cell cannot be manufactured when a clean surface showing at least a hydrophobic property as a characteristic of a clean surface of silicon cannot be obtained. By the method described in Patent Document 3, the hydrophobic property cannot be obtained in the wafer even when alkali etching proposed in claim 3 of Patent Document 3 is performed. For example, when etching is performed by 5 micrometers by alkali to a porous layer of 1 micrometer of the wafer, a hydrophobic surface can be naturally obtained. However, the porous layer is completely removed, and only reflectance equivalent to that of the alkali texture can be obtained and the reflectance reduction effect is lost.

Patent Document 3 only describes "metal was deposited on a silicon substrate surface" and "silver remaining on the surface was removed". However, according to Patent Document 4 which describes etching by hydrofluoric acid of silicon to which a metal is adhered, a portion adhered with a metal and its periphery are etched. That is, Patent Document 4 describes that the silicon is etched by a mechanism as if a metal forms pores on the silicon substrate like a drill. Therefore, according to the method described in Patent Document 3, the deposited metal remains at bottoms of the pores. This metal is diffused in a solar-cell manufacturing process and lowers the crystal quality, thereby substantially degrading the characteristic of the solar cell. This is also indicated by reduction of sensitivity in a wavelength range of 800 to 1,200 nanometers in which the crystal quality is reflected on the internal quantum efficiency shown in FIG. 8.

As described above, according to the method described in the example of Patent Document 3, it is quite difficult to remove a porous layer by alkali to such an extent that the reflectance reduction effect of the wafer having a metal deposited at the bottoms of pores is not lost, and to remove by acid the metal remaining at the bottoms of the pores. This is for the following reason. When etching by alkali is not sufficiently performed, a chemical (acid) does not easily reach the bottoms of the pores, and therefore, the metal is not easily removed. When the amount of etching by alkali is increased to facilitate removing of the metal, a characteristic of alkali etching that an etching speed is different depending on a crystal plane becomes significant. As a result, as compared with the case of an alkali texture, the reflectance reduction effect is lost. Further, even when the porous layer is removed by alkali to such an extent that the reflectance reduction effect is not lost and even when the metal at the bottoms of the pores can be removed by subsequent acid treatment, two processes of removing the porous layer and removing the metal become necessary, which results in a complex manufacturing process.

Therefore, a solar cell manufacturing method capable of obtaining a clean wafer surface having low reflectance by performing the removing of the porous layer and the removing of the metal in one process is proposed as exemplary embodiments of the present invention. The solar cell manufacturing methods according to the embodiments of the present invention are explained in detail below. The present invention is not limited to these embodiments.

First Embodiment

Figure 1:
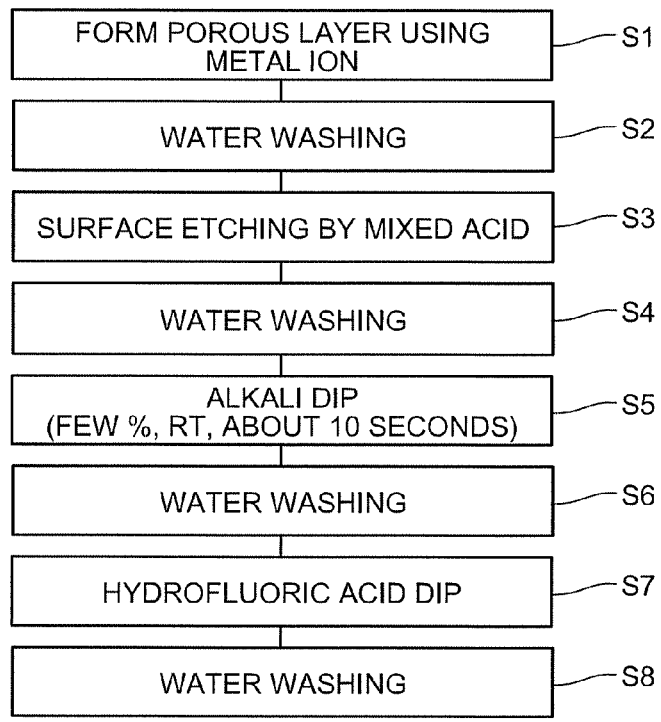
FIG. 1 is a flowchart for explaining a solar cell manufacturing method according to first and second embodiments of the present invention.

A solar cell manufacturing method according to a first embodiment of the present invention is explained. FIG. 1 is a flowchart for explaining the solar cell manufacturing method according to the first embodiment. The solar cell manufacturing method according to the first embodiment is explained below with reference to the flowchart shown in FIG. 1.

Figure 2:
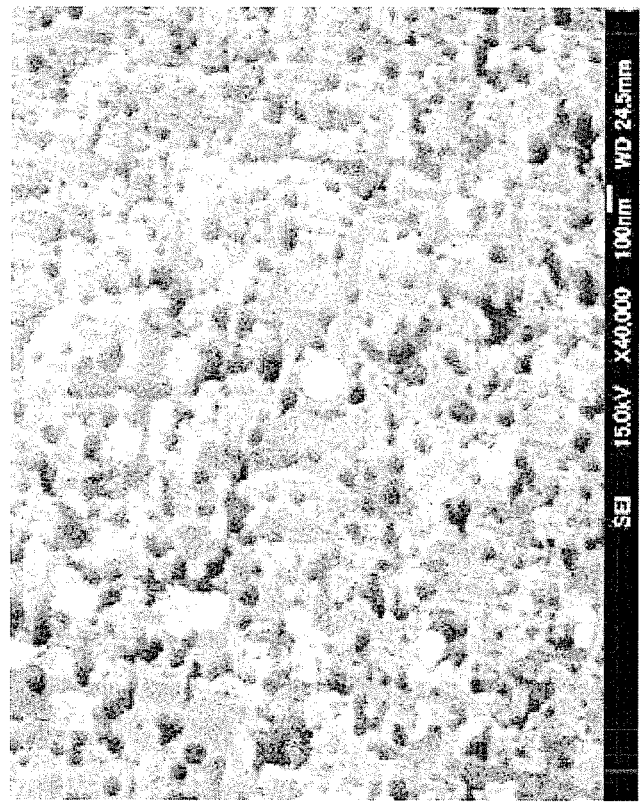
FIG. 2 is an image of an electron microscope obtained by imaging a porous layer of a wafer which is etched by a mixed solution of a hydrogen peroxide solution containing an Ag ion and hydrofluoric acid.

A p-type polycrystalline silicon wafer (doped with boron, 1 to 3 $\Omega$cm, 15×15 cm, a thickness of 280 micrometers) is prepared. The polycrystalline silicon wafer is manufactured by slicing with a wire saw an ingot obtained by cool-solidifying molten silicon. Therefore, damage during the slicing remains on the surface of the polycrystalline silicon wafer. This damaged layer is first removed by alkali. The wafer is then dipped into a chemical prepared by adding a caustic silver aqueous solution (0.1 mole) to a mixed chemical of hydrofluoric acid, hydrogen peroxide, and water, to obtain a predetermined Ag ion concentration (hereinafter, [Ag+]). Accordingly, a porous layer is formed on the surface of the polycrystalline silicon wafer (Step S1). In practice, etching was performed for 3 minutes in a state that the wafer is erected in a bath containing a chemical of HF (50%):H2O2 (60%):H2O:AgNO3 (0.1 mole)=400 milliliters:200 milliliters:1, 600 milliliters:4.4 milliliters ([Ag+]=2E-4M). FIG. 2 depicts the porous layer formed at this time.

While the porous layer was formed this time in a state that the wafer is erected, being accommodated in a cassette, the porous layer can be also formed by etching a wafer by horizontally arranging this wafer in a flat vessel such as a pad. However, when the porous layer is formed in this way, hydrogen generated by the etching is confined beneath the wafer, and this degrades uniformity of etching on the lower surface. Therefore, it is preferable to manufacture a solar cell such that a surface facing upward during the etching becomes a light-receiving surface.

After performing the process at Step S1, the wafer is washed with water, and is dried (Step S2). The wafer surface is etched by a mixed acid mainly containing hydrofluoric nitric acid to such an extent that the reflectance reduction effect is not lost (Step S3). Actually, the etching is performed for 3 minutes by a mixed acid having a content ratio of HF (50%):HNO3 (69%):H2O:=1:9:15.

While the wafer was processed horizontally by using a chemical in a pad this time, the wafer was swung in the chemical so as not to generate unevenness in the chemical concentration during the etching. Also in this case, hydrogen generated by the etching is also confined beneath the wafer, and uniformity of the etching of the lower surface is degraded. Therefore, it is preferable again to manufacture a solar cell such that a surface facing upward during the etching becomes a light-receiving surface. The etching can be of course performed in a state that the wafer is erected in a cassette.

Figure 23:
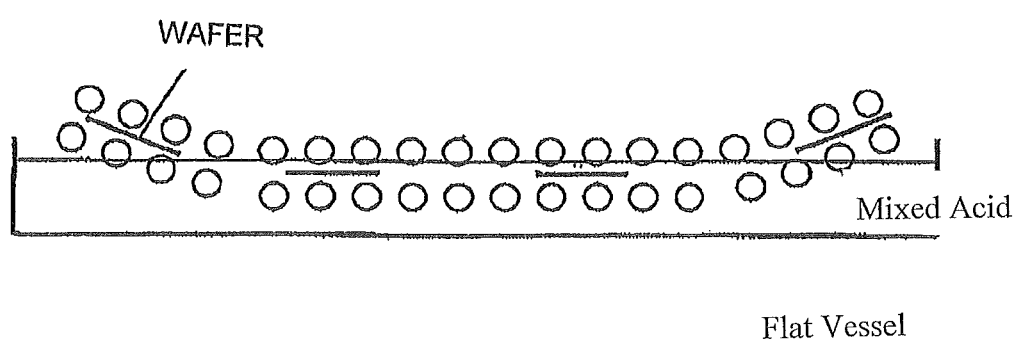
FIG. 23 shows the silicon substrate set horizontally wherein the surface facing upward is the light receiving surface of the solar cell.

Recently, devices that etch a wafer by horizontally conveying the wafer into a chemical have been marketed. When the present technique is applied by using this device, it is important that an upper surface of the wafer during etching is set as a light-receiving surface of a solar cell. See FIG. 23. It is also important to uniformly etch by stirring or circulating the chemical regardless of manners of the etching (etching by setting the wafer into a cassette, or by horizontally conveying the wafer into the chemical without putting the wafer into a cassette).

After Step S3, the wafer is washed with water (Step S4), and etched for 10 seconds in a sodium hydroxide aqueous solution of 1% (Step S5). When silicon is etched by hydrofluoric nitric acid, the wafer surface is discolored in some cases, although this depends on a chemical ratio of hydrofluoric nitric acid used. A film causing this discoloring is called "stain film" or the like. When etching the porous layer by the mixed acid mainly containing the hydrofluoric nitric acid like at Step S3, this stain film is sometimes formed on the wafer surface. At Step S5, the wafer is etched by the sodium hydroxide aqueous solution of 1% to remove this stain film. Although the sodium hydroxide aqueous solution of 1% is used here at a room temperature, any kind of chemical can be used when the chemical is an alkali aqueous solution. A concentration of the alkali aqueous solution is about 5% at maximum, and a chemical temperature can be about the room temperature.

After Step S5, the wafer is washed with water (Step S6), and a natural oxide film on the wafer surface is removed by hydrofluoric acid (Step S7). Then, a hydrophobic surface appears on the wafer surface. The wafer is washed with water last (Step S8). A resultant wafer is a wafer according to the present embodiment.

Figure 3:
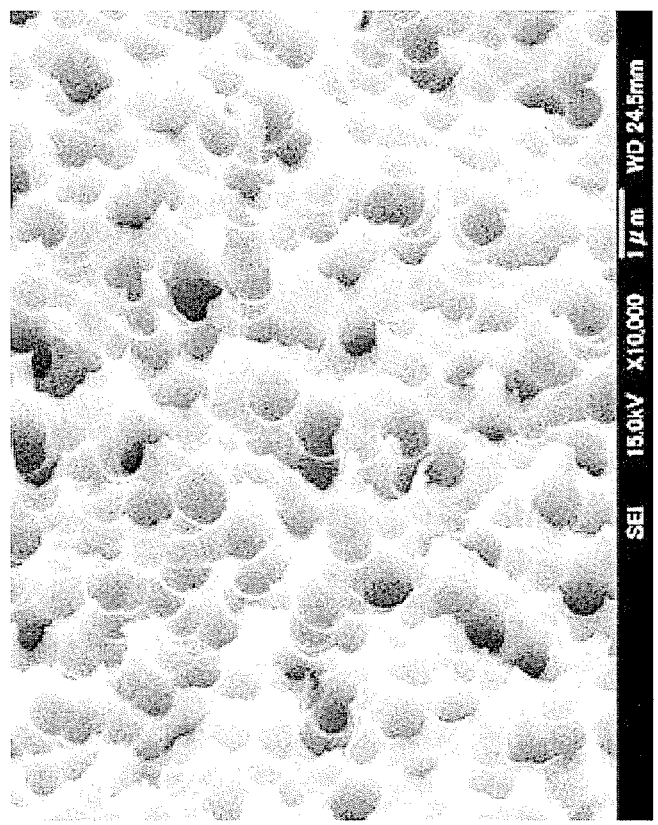
FIG. 3 is an image of an electron microscope obtained by imaging a texture formed on a silicon substrate surface by etching a porous layer by a mixed acid mainly containing hydrofluoric nitric acid, in the solar cell manufacturing method according to the first embodiment of the present invention.
Figure 4:
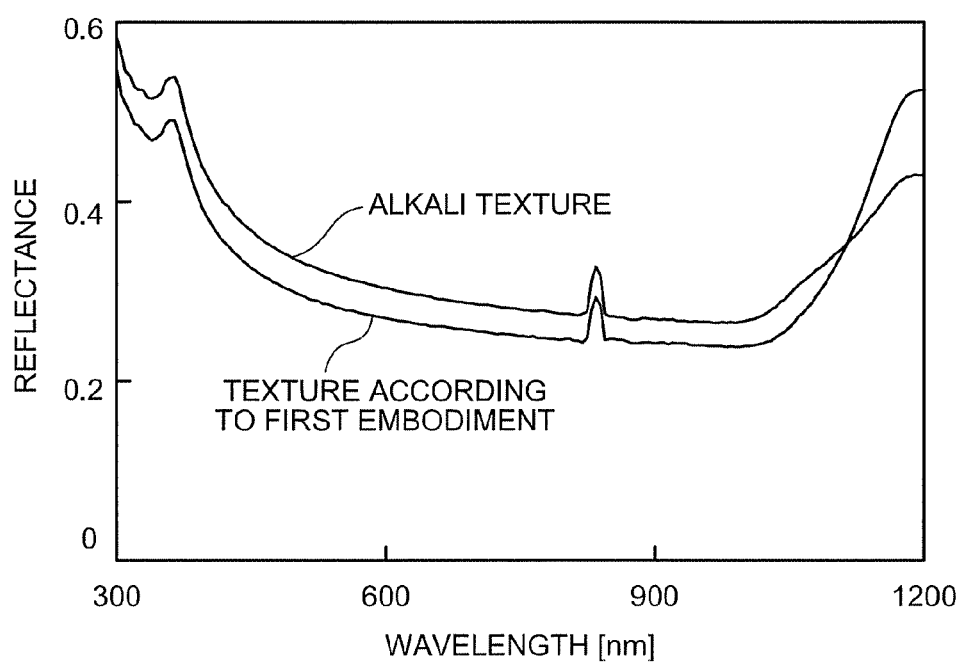
FIG. 4 is a graph of reflectance of the texture manufactured by the solar cell manufacturing method according to the first embodiment of the present invention and reflectance of an alkali texture.

FIG. 3 depicts a texture formed in the above processes. As compared with the wafer shown in FIG. 2, it is clear that a surface of the water according to the present embodiment as shown in FIG. 3 has larger diameters of pores, and that this state is preferable to remove the metal at the bottoms of the pores. FIG. 4 is a graph comparing reflectance between the wafer according to the present embodiment and a wafer to which an alkali texture is applied. This alkali texture was manufactured as follows for the sake of comparison. An ingot which was the same as that of the wafer according to the present invention was sliced, and a damaged layer was removed. A resultant ingot was etched for 9 minutes by a liquid solution having 600 milliliters of IP added to a sodium hydroxide aqueous solution (6.3%, 80° C.), thereby manufacturing this alkali texture. It is clear from FIG. 4 that the surface of the wafer according to the present embodiment obtains lower reflectance than that of the alkali texture manufactured for comparison.

Next, FIG. 20 depicts short-circuit photoelectric-current densities Jsc of solar cells (cell size: 15×5 cm) manufactured by applying the processes shown in FIG. 7, for the wafer according to the present embodiment and the wafer to which the alkali texture is applied. As shown in FIG. 20, it is clear that the wafer according to the present embodiment has a short-circuit photoelectric-current density of the solar cell improved from that of the wafer to which the alkali texture is applied.

At Step S1, although it is explained that Ag is used as a metal ion, copper or nickel can be used instead of silver. Among metal ions (silver, copper, nickel, platinum, palladium, and gold) listed in Patent Document 3, platinum and gold as metals other than the above cannot be removed in the process at Step S3.

The etching at Step S3 occurs by a mechanism of oxidizing silicon by nitric acid, and removing the oxidized silicon by hydrofluoric acid. Therefore, when a content rate of nitric acid is large, a speed of oxidizing the silicon is larger than a speed of removing the silicon. Consequently, a speed of etching the silicon becomes slow. In this way, the etching speed is determined by a chemical ratio of hydrofluoric acid and nitric acid. Further, water is added to adjust the etching speed.

Figure 9:
FIG. 9 is an image obtained by imaging an appearance of a wafer etched by a mixed solution of a hydrogen peroxide solution containing an Ag ion of 2E-4M and hydrofluoric acid.
Figure 10:
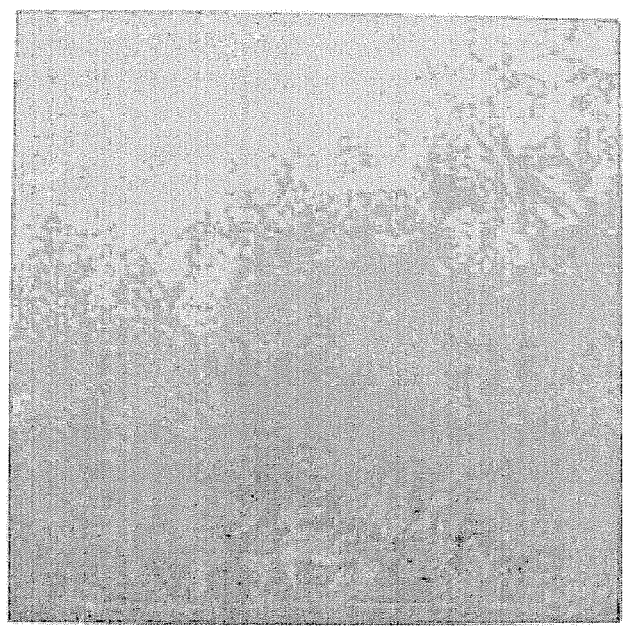
FIG. 10 is an image obtained by imaging an appearance of a wafer obtained by etching for 3 minutes the porous layer shown in FIG. 9 by a mixed acid of HF (50%):HNO3 (69%):H2O=1:4:15.
Figure 11:
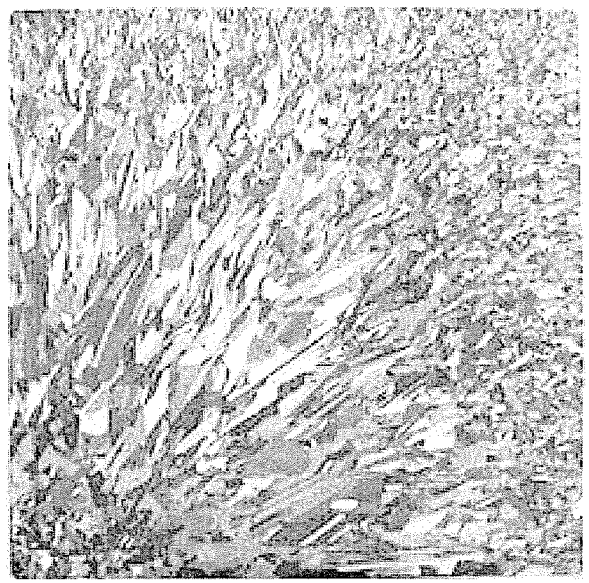
FIG. 11 is an image obtained by imaging an appearance of a wafer obtained by etching for 3 minutes the porous layer shown in FIG. 9 by a mixed acid of HF (50%):HNO3 (69%):H2O=1:5:15.

In the present example, the chemical having a content ratio of HF (50%):HNO3 (69%):H2O=1:9:15 is used. Because the amount of added water and the etching time can be adjusted, a proportion of nitric acid in this chemical can be changed when a ratio of content of nitric acid to hydrofluoric acid is equal to or larger than 6:1. When the ratio of content of nitric acid to hydrofluoric acid is smaller than 6:1, a situation becomes different. FIGS. 10, 11, 13, and 14 are images obtained as follows. A wafer formed with a porous layer was obtained by etching a wafer for 3 minutes by a chemical of HF (50%):H2O2 (60%):H2O:AgNO3 (0.1 mole)=400 milliliters:200 milliliters:1,600 milliliters:4.4 milliliters ([Ag+]= 2E-4M). This wafer formed with the porous layer was etched for 3 minutes by chemicals of HF (50%):HNO3 (69%):H2O=1:x:15, where x as an amount of nitric acid was changed to 4, 5, 6, and 9, respectively for the chemicals, to obtain four wafers. FIGS. 10, 11, 13, and 14 are the images obtained by imaging appearances of these four wafers. (To remove a stain film from these wafers, each wafer was etched for 10 seconds by NaOH of 1%). For comparison, FIG. 9 depicts an image obtained by imaging an appearance of a wafer formed with a porous layer obtained by etching the wafer by the chemical of HF (50%):H2O2 (60%):H2O: AgNO3 (0.1 mole)=400 milliliters:200 milliliters:1,600 milliliters:4.4 milliliters ([Ag+]=2E-4M).

Figure 12:
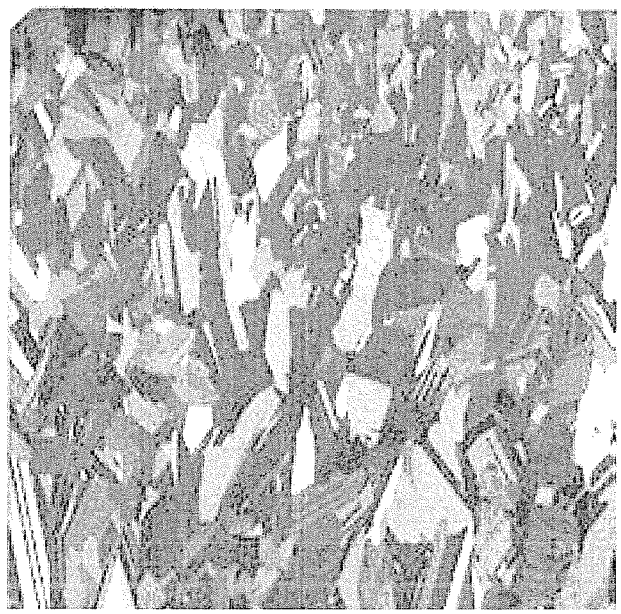
FIG. 12 is an image obtained by imaging a stain film generated at an end of the wafer shown in FIG. 11.
Figure 13:
FIG. 13 is an image obtained by imaging an appearance of a wafer obtained by etching for 3 minutes the porous layer shown in FIG. 9 by a mixed acid of HF (50%):HNO3 (69%):H2O=1:6:15.
Figure 14:
FIG. 14 is an image obtained by imaging an appearance of a wafer obtained by etching for 3 minutes the porous layer shown in FIG. 9 by a liquid solution of HF (50%):HNO3 (69%):H2O=1:9:15.

When a ratio of nitric acid to hydrofluoric acid is 4:1, nitric acid is too small. Therefore, the porous layer is etched quite slowly. When a rate of nitric acid is increased to 5, the porous layer can be removed; however, a formed stain film cannot be removed by alkali, and the stain film remains at an end of the wafer as shown in FIG. 12. FIG. 12 is an image obtained by imaging a stain film generated at the end of a wafer obtained by etching the porous layer shown in FIG. 9 for 3 minutes by a mixed acid of HF (50%):HNO3 (69%):H2O=1:5:15. On the other hand, when the rate of nitric acid becomes equal to or larger than 6, the stain film can be completely removed without remaining. Therefore, it is suitable to use a mixed acid having a content ratio of nitric acid (60%) to hydrofluoric acid (50%) as 6:1 or at a higher ratio.

In the processes shown in FIG. 7, the solar cell was manufactured by forming the pn junction by the thermal diffusion method using the polycrystalline silicon wafer as the substrate. However, the solar cell can be of course manufactured by using a monocrystalline silicon substrate, or can be manufactured by forming a pn junction by depositing amorphous silicon or the like by chemical vapor deposition (CVD) or the like.

As explained above, according to the first embodiment of the present invention, a porous layer formed by using a metal ion is etched by a mixed acid mainly containing hydrofluoric acid and nitric acid to such an extent that the reflectance reduction effect is not lost. Accordingly, a clean silicon surface can be obtained while maintaining the reflectance reduction effect, and a metal at bottoms of the pores can be removed. Therefore, there is an effect that a solar cell having high efficiency can be manufactured. Further, because the etching is performed simultaneously with the removal of a metal, there is an effect that the manufacturing process can be simplified. When the mixed acid mainly containing hydrofluoric acid and nitric acid is used at a content ratio of nitric acid of 60% to hydrofluoric acid of 50% as 6:1 or at a higher ratio, there is an effect that etching which achieves both a high etching speed and easy surface processing after the etching can be performed. Further, when the etching is performed by using an etching-dedicated device by the mixed acid mainly containing hydrofluoric acid and nitric acid, the etching is performed while stirring the mixed acid. Therefore, there is an effect that it is possible to prevent the concentration of the mixed-acid liquid solution from becoming nonuniform on the wafer surface due to a progress of the etching. In the process of forming the porous layer by using the metal ion or in the process of etching by the mixed acid mainly containing hydrofluoric acid and nitric acid, when the silicon substrate is set horizontally or is dipped by horizontally conveying the silicon substrate, a surface facing upward is set as a light-receiving surface of a solar cell. Therefore, there is an effect that the etching of the light-receiving surface can be prevented from becoming nonuniform due to the influence of hydrogen generated.

Second Embodiment

The present inventors manufactured a solar cell by using a silicon substrate formed with a porous layer by changing a metal ion concentration, and checked the influence that the metal ion concentration gives to the solar cell. This is explained in detail as a second embodiment of the present invention.

A manufacturing method according to the second embodiment was performed as shown in FIG. 1 in a similar manner to that of the first embodiment. At Step S1 in FIG. 1, two wafers were cut out from one ingot, and a damaged layer was removed from these wafers. These two wafers were etched for 3 minutes by chemicals obtained by adding a caustic silver aqueous solution of 0.1 mole by 2.2 milliliters ([Ag+]=1E-4M) and 1.1 milliliters ([Ag+]=5E-5M), respectively to a chemical of HF (50%):H2O2 (60%):H2O=400 milliliters: 200 milliliters:1,600 milliliters. At Step S3, etching was performed for 3 minutes by a mixed acid of HF (50%):HNO3 (69%):H2O=1:9:15. After performing the processes up to Step S8, a solar cell (cell size: 2×2 cm) was manufactured following the processes shown in FIG. 7.

FIG. 21 depicts short-circuit photoelectric-current densities Jsc of these two solar cells together with a short-circuit photoelectric-current density Jsc of an alkali texture cell manufactured by cutting out from the same ingot, When [Ag+]=1E-4M was added, the short-circuit photoelectric-current density Jsc was about the same as that of the alkali texture, and when [Ag+]=5E-5M was added, a clear reduction of the short-circuit photoelectric-current density Jsc was observed. Regardless of the same etching time, a solar cell having a lower [Ag+] had a lower characteristic.

Figure 15:
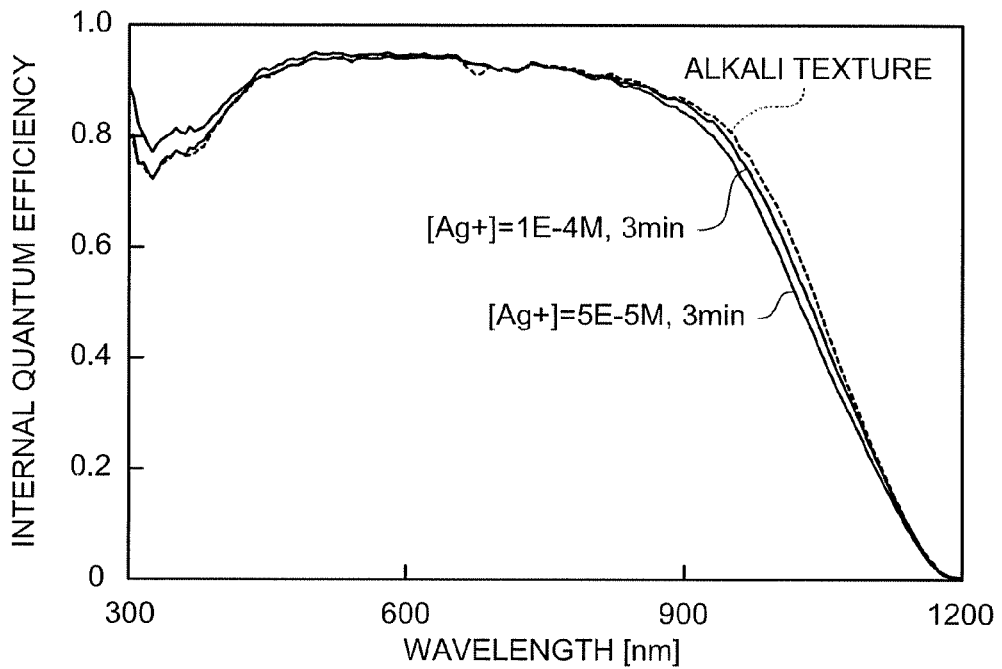
FIG. 15 is an explanatory diagram of a comparison between internal quantum efficiencies when an Ag ion concentration in a mixed solution of a hydrogen peroxide solution containing an Ag ion and hydrofluoric acid is changed.

FIG. 15 depicts comparison in internal quantum efficiency between the cells manufactured based on the addition of [Ag+]=1E-4M, 5E-5M and the alkali texture cell. With reference to FIG. 15, the cells manufactured by adding [Ag+]=1E-4M, 5E-5M have lower sensitivity in a wavelength region of 800 nanometers or above as compared with the alkali texture cell. This is attributable to a fact that the metal deposited at the time of forming a porous layer cannot be completely removed, and suggests that this tendency is higher when the metal ion concentration is lower.

Figure 16:
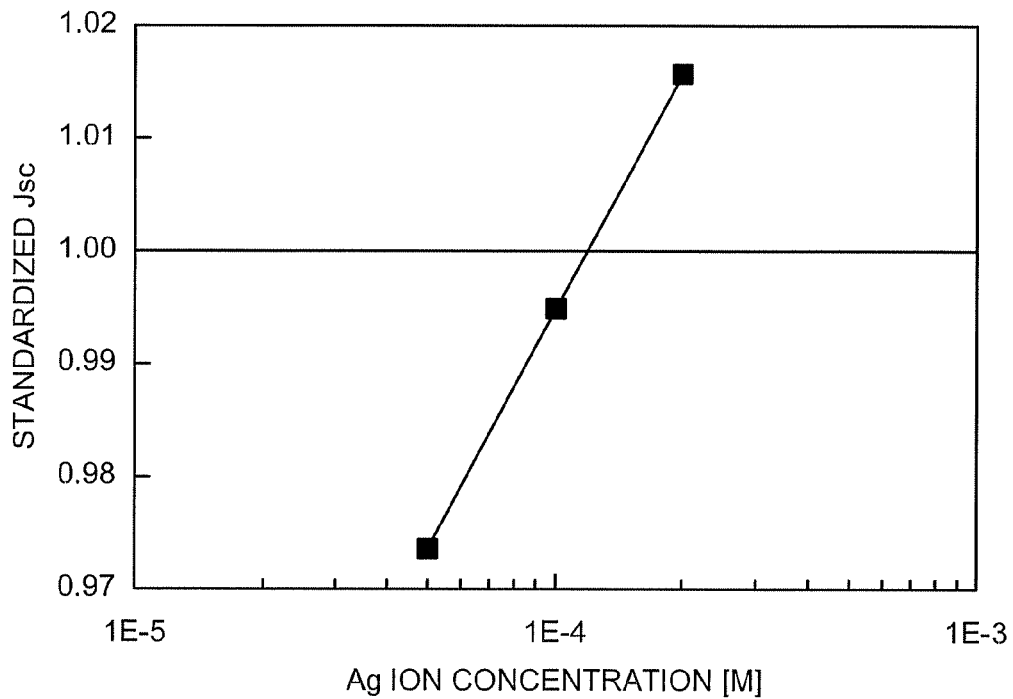
FIG. 16 is a graph of standardization short-circuit photoelectric-current densities when an Ag ion concentration is changed.

FIG. 16 is a comparative diagram of a short-circuit photoelectric-current density also including a solar cell similarly manufactured by using a mixed liquid solution of [Ag+]=2E-4M at Step S1. However, an ingot from which a wafer of the solar cell manufactured by using the mixed liquid solution of [Ag+]=2E-4M was cut out was not the same ingot as that used for the explanation in the first embodiment and the ingot of the two wafers according to the present embodiment. In FIG. 16, to compare characteristics of solar cells manufactured by using wafers cut out from different ingots, alkali texture cells were manufactured from the same ingot as that of the wafers of the respective solar cells, and plotting was performed by using values standardized by values of the short-circuit photoelectric-current density of the alkali texture cells. In FIG. 16, when a concentration of Ag becomes equal to or higher than 1E-4M, a characteristic of the solar cell is improved by the same level or more of improvement of the characteristic of the alkali texture cell. Therefore, to obtain a solar cell of high efficiency, it is clear that a metal ion concentration of the mixed liquid solution used at Step S1 at least needs to be equal to or higher than 1E-4M.

When the metal ion concentration becomes low, a metal depositing speed becomes slow, and a size of the deposited metal is prone to vary. On the other hand, according to Patent Document 4, pores are formed by catalytic action of a metal. Therefore, a depth of each pore receives the influence of the size of the deposited metal. Accordingly, a metal particle which is fast deposited fast reaches a sufficiently large size to form a pore in silicon, and a depth of the formed pore is large. On the other hand, a metal particle which is slowly deposited slowly reaches a sufficiently large size to form a pore, and a depth of the formed pore is small. As a result, a porous layer having various depths of pores is formed. The porous layer is then removed by a mixed acid mainly containing hydrofluoric nitric acid to such an extent that a reflectance reduction effect is not lost. Because it is preferable that irregularities be present in as large a proportion as possible of a region, etching is performed to such an extent that shallow pores remain. when deep pores are present in this case, a metal which forms the deep pores cannot be completely removed, and this gives a bad influence to the characteristic of the solar cell. Accordingly, it is preferable that the deposited metal have a small variation in sizes. That is, a solar cell of high efficiency can be more easily manufactured when etching is performed for a short time by a mixed liquid solution of a high metal-ion concentration than when etching is performed for a long time by a mixed liquid solution of a low metal-ion concentration.

Figure 17:
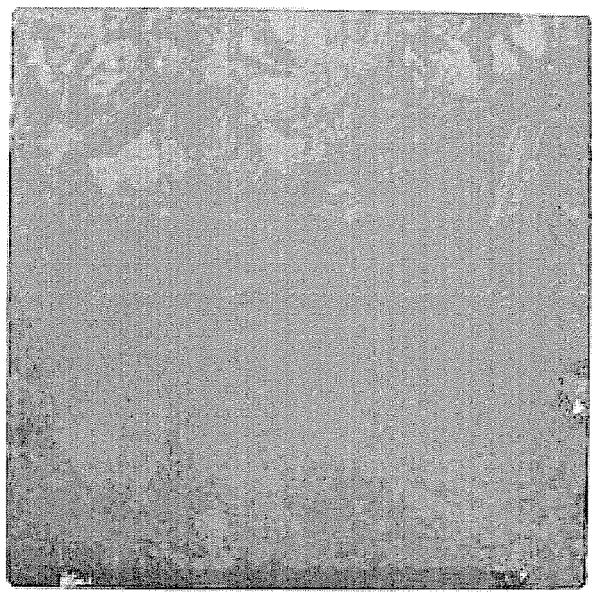
FIG. 17 is an image obtained by imaging an appearance of a wafer etched for 3 minutes by a mixed solution of a hydrogen peroxide solution containing an Ag ion of 4E-4M and hydrofluoric acid.
Figure 18:
FIG. 18 is an image obtained by imaging an appearance of a wafer etched for 3 minutes by a mixed solution of a hydrogen peroxide solution containing an Ag ion of 8E-4M and hydrofluoric acid.
Figure 22A:
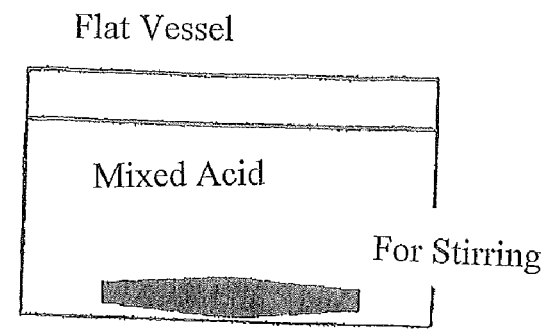
FIGS. 22A and 22B show step 3 in FIG. 1 etching the surface of the silicon substrate is performed while circulating or stirring the mixed acid.
Figure 22B:
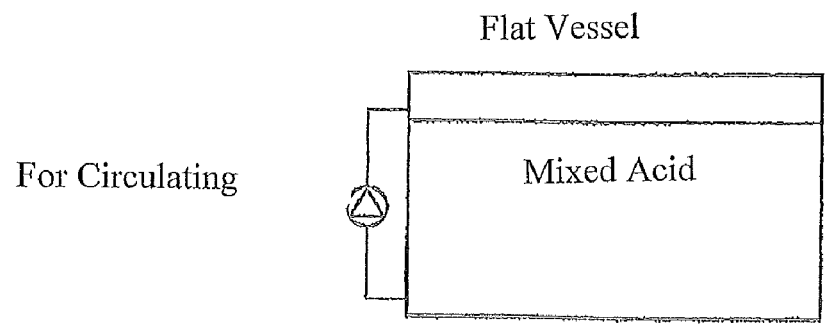

However, when the metal ion concentration is too high, a metal deposited on the wafer becomes too much, and the wafer has a color of a used metal. FIGS. 17 and 18 are images obtained by imaging appearances of wafers etched for 3 minutes by chemicals obtained by adding a caustic silver aqueous solution of 0.1 mole by 8.8 milliliters ([Ag+]=4E-4M), 17.6 milliliters ([Ag+]=8E-4M), respectively to a chemical of HF (50%):H2O2 (60%):H2O=400 milliliters:200 milliliters:1, 600 milliliters. It is clear from the comparison of these images that when the chemical of [Ag+]=8E-4M is used, the wafer has a color of Ag (white) due to deposited Ag.

When this wafer is etched by a mixed acid mainly containing hydrofluoric nitric acid, there is no problem in the characteristic of a solar cell. However, there are demerits in cost such that a large quantity of metal ions is necessary at the time of forming a porous layer and that a chemical life of the mixed acid becomes short because of the removal of a large quantity of metals.

It becomes clear from the above that the metal concentration in a mixed liquid solution containing metal is preferably equal to or higher than 1E-4M and lower than 8E-4M.

As explained above, in the solar cell manufacturing method according to the second embodiment of the present invention, there are effects that a solar cell of high efficiency can be manufactured by using the metal ion concentration equal to or higher than 1E-4M and lower than 8E-4M for a mixed liquid solution containing a metal ion to be used to form a porous layer in a silicon substrate, and that chemical cost can be decreased.

INDUSTRIAL APPLICABILITY

As described above, the solar cell manufacturing method according to the present invention is useful for a method of manufacturing a silicon solar cell, and is particularly suitable to form fine irregularities (texture) on the surface of a silicon substrate.

The invention claimed is:

1. A method of manufacturing a solar cell having a texture on a surface of a silicon substrate, the method comprising:
   a first forming including forming a porous layer on the surface of the silicon substrate by dipping the silicon substrate into a mixed aqueous solution of oxidizing reagent containing metal ions and hydrofluoric acid; and
   a second forming including forming a texture by etching the surface of the silicon substrate, to an extent that a reflectance reduction effect is not lost and a metal at a bottom of pores of the porous layer is removed, after the first forming by dipping the silicon substrate into a mixed acid mainly containing hydrofluoric acid and nitric acid.

2. The method according to claim 1, wherein the mixed acid consists of 60% nitric acid and 50% hydrofluoric acid with a content ratio of 6:1 or more.

3. The method according to claim 1, further comprising etching the silicon substrate after the second forming using an alkali chemical.

4. The method according to claim 1, wherein the second forming further includes etching the surface of the silicon substrate after the first forming while circulating or stirring the mixed acid.

5. The method according to claim 1, wherein at least one of the first forming and the second forming further includes, when the silicon substrate is set horizontally or is dipped by horizontally conveying the silicon substrate, setting a surface facing upward as a light-receiving surface of the solar cell.

6. The method according to claim 1, wherein a metal ion concentration of the mixed aqueous solution is equal to or higher than 1 E-4M and lower than 8E-4M.

* * * * *